United States Patent

[11] 3,571,625

[72] Inventors Edwin J. Braun
Middleton;
Stanley G. Student, Jr., Freehold, N.J.

[21] Appl. No. 747,649
[22] Filed July 25, 1968
[45] Patented Mar. 23, 1971
[73] Assignee Bell Telephone Laboratories Incorporated
Murray Hill, Berkley Heights, N.J.

[54] PULSE AMPLIFIER WITH POSITIVE FEEDBACK
8 Claims, 2 Drawing Figs.

[52] U.S. Cl. .......... 307/263, 307/268, 330/26, 330/110
[51] Int. Cl. .......... H03k 6/04
[50] Field of Search .......... 307/268, 263, 264; 330/26, 86, 110, 112

[56] References Cited

UNITED STATES PATENTS

| | | | |
|---|---|---|---|
| 2,986,707 | 5/1961 | Blecher | 330/112X |
| 3,049,629 | 8/1962 | Reach | 307/268X |
| 3,281,704 | 10/1966 | Crain | 330/26 |
| 3,376,434 | 4/1968 | Wenstock | 307/268 |

*Primary Examiner*—Roy Lake
*Assistant Examiner*—James B. Mullins
*Attorneys*—R. J. Guenther and James Warren Falk

ABSTRACT: A network connected between the output and the input of a two-transistor pulse amplifier provides regenerative feedback which improves the transient response of the amplifier. The feedback network includes a transistor so connected that the regenerative feedback is operative only during pulse transitions.

INVENTORS E. J. BRAUN
S. G. STUDENT, JR.
BY J S Cubert
ATTORNEY

PULSE AMPLIFIER WITH POSITIVE FEEDBACK

BACKGROUND OF THE INVENTION

Our invention is related to pulse circuits and more particularly to pulse amplifier circuits utilizing regenerative feedback.

Amplifiers are generally used to faithfully reproduce input signals at higher energy levels. In some pulse applications, however, fidelity is not required and it is desirable that the input pulse be reshaped to exhibit faster transition times. This can readily be achieved by including a regenerative feedback network in the pulse amplifier. As is well known in the art, such feedback speeds up the amplifier response so as to alter the waveform of the output therefrom. If the regenerative feedback network is always operative, however, oscillations or unwanted regenerative peaking may be present in the output pulse. Nonlinear limiting devices such as diodes can be connected to the amplifier output terminal to limit such undesired effects. But the diode limiting arrangements for this purpose are not entirely satisfactory because their effectiveness at low current levels is limited, diode transient effects can interfere with proper circuit operation, and additional voltage sources are usually needed.

When a pulse amplifier is operated at relatively low current levels, it is sensitive to noise and other unwanted low level signals which may be coupled to the amplifier. In particular, hum or low frequency AC signals from the amplifier power supply can be present at the amplifier input so that the amplifier responds thereto and the output of the amplifier contains pulses which are due to the power supply hum as well as to the desired input signal. The inclusion of a regenerative feedback arrangement in a low current level amplifier is effective to speed up its transient response, but the amplifier then responds to the unwanted signals at the input by forming pulses which adversely affect load devices connected to the amplifier. Where the transient response is made substantially faster than the transitions in the hum signal, pulses due to the hum at the amplifier output are avoided. This is so if the feedback is effective only during the transitions when the amplifier sensitivity is maximum. Therefore, it is desired only to provide feedback during the transitions of the input pulses whereby the aforementioned undesired effects are avoided.

BRIEF SUMMARY OF THE INVENTION

Our invention is a pulse circuit in which a feedback network is connected from an output coupling device to an input coupling device. The network includes a plurality of cascaded elements which operate to regeneratively feed back a portion of the amplifier output signal. A nonlinear device is connected to one or more junctions between the cascaded feedback elements so that the regenerative feedback is inhibited during the constant value portion of said input pulse. In this way, the feedback is applied to the circuit input only during transitions of the input pulses.

In one illustrative embodiment of our invention a pair of transistors are connected in cascade to form a pulse amplifier. The collector of the output transistor is coupled to the base of the input transistor through a pair of series-connected resistors, and the junction between the two series-connected resistors is connected to the base of a third transistor, the emitter of which is returned to a ground reference potential. When the constant value voltage portion of the pulse is applied to the input of the first transmitter transistor, the base-emitter diode of the third transistor prevents any possible regenerative feedback action through the series-connected resistors. During transitions in the signal applied to the first transistor base, the base-emitter diode of the third transistor is ineffective to limit the feedback because of the changes in signal level at the second transistor collector. In accordance with our invention, the regenerative feedback is effective to speed up the amplifier transient response only during input pulse transitions.

DETAILED DESCRIPTION

Figure 1:
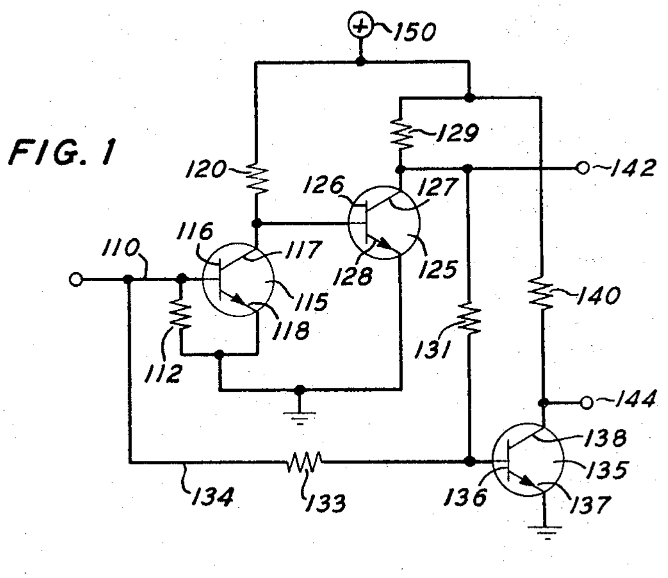
FIG. 1 depicts an illustrative embodiment of our invention.

A pulse amplifier is shown in FIG. 1 in which input signals applied to lead 110 are amplified in the cascaded circuit arrangement comprising NPN transistors 115 and 125. Series-connected resistors 131 and 133 provide a feedback path between collector 127 of output transistor 125 and base 116 of input transistor 115. This feedback path is regenerative since a positive change in voltage at collector 127 due to a positive-going input pulse causes a similar positive change in voltage at base 116. Transistor 135 operates as an amplifier transistor and additionally acts as a nonlinear element which controls the regenerative feedback through resistors 131 and 133 during the positive transition and positive constant portion of the input pulse. The amount of regenerative feedback is determined by the base-emitter diode of transistor 135. Base 136 is connected to the junction between resistors 131 and 133. Emitter 137 is returned to a ground reference potential as are emitters 118 and 128.

When the signal applied to lead 110 is substantially at the ground reference potential, transistor 115 is cut off and current flows from positive voltage source 150 into base 126 via resistor 120 and through the base-emitter path of transistor 125 to emitter 128. This current renders transistor 125 conductive so that current flows through resistor 129. Collector 127 is substantially at the ground reference potential. Under these conditions the voltage at base 136 is not sufficient to permit conduction of the base-emitter diode of transistor 135. But since the voltage at collector 127 is substantially the same as the voltage at base 116, there is no current flowing through resistors 131 and 133 which can cause amplification via cascaded transistors 115 and 125.

When the voltage applied to base 116 via lead 110 is sufficient to saturate the base-emitter diode of transistor 115, the current from positive voltage source 150 flows through resistor 120 to collector 117 and the voltage at collector 117 is substantially that of the ground reference potential. This voltage is applied to base 126 so that transistor 125 is substantially cut off. The voltage at collector 127 is now at a relatively high positive level due to positive voltage source 150. This positive voltage at collector 127 causes current to flow through resistor 131 and forward-biases the base-emitter diode of transistor 135. In this event, the voltage at base 136 is limited in accordance with the well-known principles of transistor operation. The voltage at base 116 is limited to substantially the same value where transistor 115 and transistor 135 are constructed of the same basic material, such as silicon, or form part of the same silicon substrate as, for example, in a monolithic integrated circuit.

During the transition from a low reverse-biasing potential to a high or forward-biasing potential at base 116, transistor 115 turns on and operates in its linear mode. In response to the positive-going pulse at base 116, a negative-going pulse appears at collector 117 and base 126 of transistor 125. This negative-going pulse transition starts to turn off transistor 125 so that a positive-going transition appears at collector 127. Since the positive-going transition at collector 127 is substantially greater than the transition at base 116, the voltage difference between collector 127 and base 116 causes current to flow through resistors 131 and 133 in a direction which aids or enhances the conduction of transistor 115. The effect of the feedback through resistors 131 and 133 is to speed up the response of the amplifier circuit including transistors 115 and 125 whereby the voltage transitions at collector 127 are faster. The feedback during the positive transition is large since transistor 135 is not conducting. The speedup continues until the base-emitter diode of transistor 135 becomes forward biased due to the increase in voltage at base 136. Some of the current from resistor 131 is then diverted into base 136 and the amount of feedback to base 116 is limited. When the voltage at base 136 approximates the voltage at base 116, current is prevented from passing through resistor 133 into base 116 and the positive feedback terminates. This occurs when the base-emitter junctions of both transistors 135 and 115 approach saturation.

The current through the base-emitter junction of transistor 135 causes this transistor to conduct and the voltage appearing at collector 138 in response thereto changes from a relatively high positive potential determined by voltage source 150 to a low potential. Thus, the voltage at output terminal 142 is high while the voltage at terminal 144 is low and the circuit of FIG. 1 provides a pair of opposite voltage outputs. It is understood that the aforementioned positive feedback may be controlled by a diode connected to the junction between resistors 131 and 133. The use of transistor 135, however, advantageously results in a pair of complimentary outputs from the pulse circuit.

When the voltage at base 116 is relatively positive so that transistor 115 is saturated, transistor 125 is cut off and transistor 135 is rendered conductive. A negative transition in the voltage at base 116 causes a corresponding positive transition in voltage at collector 117 and in accordance with the well-known principles of transistor operation there is a negative transition in voltage at collector 127. Because of the gain of the amplifier, the negative transition at collector 127 is greater than the transition at base 116 so that current flows through resistors 133 and 131 in a direction to speed up the turnoff of transistor 115. The base-emitter junction of transistor 135 is non conductive during this transition and the regenerative feedback is effective to speed up the operation of the amplifier. When transistor 115 is cut off the regenerative action ceases. At this time the voltage at output 142 is substantially at the ground reference potential while the voltage output at terminal 144 is substantially close to that of positive voltage source 150.

Figure 2:
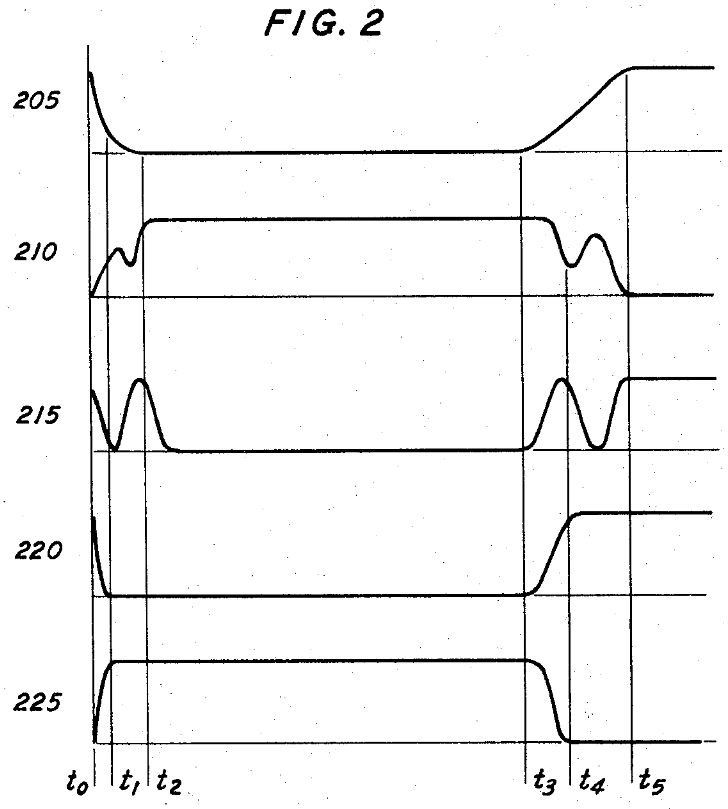
FIG. 2 shows waveforms useful in describing the operation of the embodiment of FIG. 1.

FIG. 2 shows waveforms which illustrate the operation of the circuit of FIG. 1. Waveform 205 shows an input pulse which may be applied to base 116 via lead 110. The negative transition in waveform 205 between times $t_0$ and $t_2$ causes transistor 115 to turn off and transistor 125 to be rendered conductive. A portion of the positive voltage transition at collector 127 responsive to the negative voltage transition of waveform 205 is fed back via series-connected impedances 131 and 133 to base 116 to aid the turnoff of transistor 115. The sum of the voltage of waveform 205 and the feedback signal operates to speed up the circuit transient response so that the output transition at collector 127 in response to the transition between times $t_0$ and $t_2$ is completed by time $t_1$. This output voltage transition is shown on waveform 220.

Transistor 135 conducts prior to time $t_0$ and operates in the conducting state to block any feedback signal from base 116. The negative transition at collector 127 in response to waveform 205 causes transistor 135 to turn off so that a speeded positive transition appears at collector 138. This is shown in waveform 225 between times $t_0$ and $t_1$.

During the positive-going transition of waveform 205 between times $t_3$ and $t_5$, the feedback via impedances 131 and 133 enhances the current applied to base 116 so that the positive-going transition at collector 127 is speeded up. After the voltage at base 136 is substantially equal to the voltage applied to base 116, this feedback action ceases in accordance with our invention. Thus, in response to the relatively slow positive transition of waveform 205 between times $t_3$ and $t_5$, there are relatively fast transitions in both waveforms 220 and 225 which take place between times $t_3$ and $t_4$.

As aforementioned, the amplifier of FIG. 1 may operate at relatively low current. Relatively low frequency power supply hum may be coupled to base 116 or to base 126. This hum is amplified in transistor 125. While such power supply hum is relatively ineffective when transistor 125 is fully conductive or when it is turned off, during transitions it may cause signals in the amplifier output which are not present in the input pulse. The power supply hum superimposed on the signal waveform at base 126 is shown on waveform 210. In the absence of the feedback path including impedances 131 and 133, the pulse appearing at collector 127 includes extraneous pulses which may be applied to succeeding circuits. These pulses, shown in waveform 215, are caused by the hum shown in waveform 210. The addition of the feedback path speeds up the transition response of the amplifier of FIG. 1 to an extent that prevents the relatively low frequency hum from affecting the pulse circuit operation. Thus waveform 220 which represents the output collector 127 in the presence of feedback contains no additional transitions such as illustrated in waveform 215.

The principles of our invention have been described in connection with a specific illustrative embodiment. It is to be understood that other embodiments and modifications may be devised by those skilled in the art without departing from the scope and spirit of the invention.

We claim:

1. A pulse amplifier comprising first and second transistors each having a base, an emitter and a collector, means for applying an input pulse to said first transistor base, means for transmitting a pulse from said first transistor collector to the second transistor base, and positive feedback means for applying a portion of the pulse appearing at the second transistor collector to the first transistor base, said positive feedback means comprising first and second impedances connected in series between the second transistor collector and the first transistor base, and means connected between the junction of said first and second impedances and a reference potential responsive solely to the pulse portion appearing at said junction for limiting the operation of said positive feedback means to the transition portions of the input pulse.

2. A pulse amplifier according to claim 1 wherein said feedback limiting means comprises unidirectional conducting means having at least first and second electrodes, said first electrode being directly connected to the junction of said first and second impedances and said second electrode being connected to said reference potential.

3. A pulse amplifier according to claim 1 wherein said feedback limiting means comprises a third transistor having base, an emitter and a collector, said third transistor base being directly connected to the junction of said first and second impedances and said third transistor emitter being connected to said reference potential.

4. A pulse amplifier according to claim 3 wherein all of said transistors are of one conductivity type and impedance means are connected to said third transistor collector whereby complementary pulses responsive to said input pulse appear at the second and third transistor collectors respectively.

5. A pulse amplifier comprising first, second and third NPN transistors, each having a base, an emitter and a collector, means for applying an input pulse to the first transistor base, a positive voltage source, a first impedance connected between said source and the first transistor collector, the first transistor collector being connected to the second transistor base, a second impedance connected between said source and the second transistor collector, a third impedance connected between said source and the third transistor collector, each of said emitters being connected to a ground reference potential, and regenerative feedback means connected between said second transistor collector and said first transistor base comprising a pair of series connected resistors, the third transistor base being connected to the junction of said series connected resistors.

6. A pulse circuit comprising a pair of cascaded amplifying devices each having an input and an output, means for applying a pulse to the input of the first of said amplifying devices, and a network connected between the output of the second of said amplifying devices and the input of the first amplifying device for applying a portion of the pulse appearing at the second amplifying device output responsive to said input pulse to the first amplifying device input, said network comprising a pair of series connected impedance means, and a transistor having a base, an emitter, and a collector, said base being directly connected to the junction between said impedance means and said emitter being connected to a reference potential whereby said applied pulse portion is permitted to be large during the positive transition of said input pulse.

7. A pulse circuit comprising an amplifier having an input and an output, means for applying a pulse of one polarity to said input, said amplifier being operative to produce a pulse of said one polarity at said output, and means for feeding back a portion of said output pulse to said input comprising a pair of series-connected resistors connected between said output and said input and means connected to the junction between said resistors responsive solely to the constant value portion of the pulse appearing at said junction for inhibiting said feedback during the constant value portion of said pulse.

8. A pulse circuit according to claim 7 wherein said feedback inhibiting means comprises a transistor having a base, an emitter and a collector, said base being directly connected to the junction between said resistors and said emitter being connected to a reference potential.